(12) United States Patent
Lu

(10) Patent No.: US 7,149,956 B1
(45) Date of Patent: Dec. 12, 2006

(54) CONVERGING ERROR-RECOVERY FOR MULTI-BIT-INCREMENTING GRAY CODE

(75) Inventor: Hui Lu, Union City, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 475 days.

(21) Appl. No.: 10/708,095

(22) Filed: Feb. 9, 2004

(51) Int. Cl.
*H03M 7/16* (2006.01)

(52) U.S. Cl. .................. 714/809; 341/97; 341/98; 377/34; 714/819

(58) Field of Classification Search ............. 341/94, 341/97–98; 377/34; *H03M 7/16*
See application file for complete search history.

(56) References Cited

U.S. PATENT DOCUMENTS

| | | | | |
|---|---|---|---|---|
| 3,913,094 A * | 10/1975 | Wooton, III | ............... | 341/94 |
| 4,975,698 A | 12/1990 | Kagey | ............... | 341/96 |
| 5,097,491 A | 3/1992 | Hall | ............... | 377/34 |
| 5,220,586 A | 6/1993 | Tai | ............... | 377/39 |
| 5,394,410 A | 2/1995 | Chen | ............... | 714/823 |
| 5,754,614 A | 5/1998 | Wingen | ............... | 377/34 |
| 5,923,718 A | 7/1999 | Takahashi et al. | ............... | 377/114 |
| 6,304,398 B1 | 10/2001 | Gaub et al. | ............... | 360/49 |
| 6,314,154 B1 | 11/2001 | Pontius | ............... | 377/16 |
| 6,337,893 B1 | 1/2002 | Pontius | ............... | 377/108 |
| 6,400,735 B1 | 6/2002 | Percey | ............... | 370/518 |
| 6,460,160 B1 | 10/2002 | Classon | ............... | 714/791 |
| 6,553,448 B1 | 4/2003 | Mannion | ............... | 711/2 |
| 2001/0043150 A1* | 11/2001 | Tsukamoto | ............... | 341/97 |
| 2002/0044077 A1* | 4/2002 | Tsukamoto | ............... | 341/97 |
| 2004/0017303 A1* | 1/2004 | Loewen | ............... | 341/98 |

OTHER PUBLICATIONS

Mecklenburg, P., et al.; Correction of errors in multilevel Gray coded data; Information Theory, IEEE Transactions on;☐☐vol. 19, Issue 3, May 1973 pp. 336-340.*

* cited by examiner

*Primary Examiner*—R. Stephen Dildine
(74) *Attorney, Agent, or Firm*—gPatent LLC; Stuart T. Auvinen

(57) ABSTRACT

An L-bit gray-code input value can change by more N bits at a time. The lower N bits of the input are stored as a received least-significant-bits (LSB) while the upper bits are stored as a received most-significant-bits (MSB). A stored register holds the corrected, stored MSB and LSB for use by the receiver. When the received and stored MSB's mismatch, the new MSB is stored and the stored LSB is generated so that the stored register contains the smallest possible value with the new MSB. When the received and stored MSB's match, the full L bits are compared. When the received word is larger than the stored word, the largest mis-matching bit in the LSB is found, and bits above this are copied from the received LSB to the stored register, while lower bits are generated to produce the lowest value. Repeating the process converges the result.

20 Claims, 6 Drawing Sheets

CONVERGING ERROR-RECOVERY FOR MULTI-BIT-INCREMENTING GRAY CODE

BACKGROUND OF INVENTION

This invention relates to error recovery, and more particularly to multi-bit error recovery for gray-code-encoded bit streams.

Electronic systems often use binary codes to represent values. However, binary sequences can have adjacent values that have more than one bit that changes. For example, when incrementing from binary 0111, the next binary value is 1000. All four bits change at about the same time. This can result in errors in a receiver.

Gray codes are often used to avoid the multi-bit changes that occur in binary codes. The number of bits that change in adjacent gray-code values (the hamming distance) is one. For example, the next value after gray-code 0111 is 1111. Only one bit changes at a time, reducing the likelihood of errors during transmission.

In some applications using gray code, the value can jump by more than one. FIGS. 1A–B show a gray-code application with multiple bits changing between samples. In FIG. 1A, transmitter 70 outputs a gray-code sequence onto a communication line to receiver 72. The gray-code value may be converted to serial data and encoded in a variety of ways on the physical communication line, but at some layer in transmitter 70 and in receiver 72 the data is represented as a parallel data word in a gray code sequence.

Different clock domains are used by transmitter 70 and by receiver 72. Transmitter 70 operates with a clock that is 5 times faster than the receive clock, and can be asynchronous. Gray-coded values are advanced in transmitter 70 five times faster than the received values are sampled by receiver 72. Also, transmitter 70 can advance by 2 rather than just by 1 value in the gray-code sequence.

FIG. 1B shows gray-code values transmitted and received with an error. Transmitter 70 is allowed to change more than one bit in the gray code at a time. In general, N bits of the L-bit gray-coded value can change per transmission, so the value can change by $2^N-1$ per transmission. A standard increment-only gray code has N=1, but in this example N=2. The sequence of values for a 4-bit (L=4) gray code is shown on the left column. This is a reflected gray code, since the lower 2 bits in each group of 4 values are reflected between the adjacent groups of four values.

Both the transmitter and receiver start out with a gray-code value of 0000. The transmitter advances its output value by 2 for several transmit clocks, outputting 0000, then 0011 on the next transmitter clock, then 0110, then 0101, then 1100, and finally 1111, as shown in the second column. This occurs over 5 periods of the transmitter's clock.

The clock for receiver 72 is 5 times slower than the clock for transmitter 70. After the initial value of 0000 is sampled by receiver 72, the next input value is not sampled until 5 transmitter clocks later, when the transmitted value has advanced to 1111. The transmitter changes its output from 1100 to 1111 at about the time the receiver samples the communications line. Since the lower 2 bits are changing during the sampling time, the value sampled by the receiver is 11XX, as the exact value of the lower 2 bits depends on the exact relative timing to the receiver's sample-clock edge.

The value sampled by the receiver, 11XX, could be 1100 is sampled early, or 1111 if sampled late, or 1101 or 1110 is sampled as the 2 lower bits are changing. Metastability could occur in the lower bits, making the value sampled variable. If the receiver samples 1100, 1110, or 1111, the sequencing logic on receiver 72 can probably later receiver, since these gray-code values are less that or equal to the transmitted value of 1111.

However, if receiver 72 samples 1110, a fatal error can occur in logic in receiver 72. The value 1110 is after the transmitted value 1111 in the gray-code sequence. If the gray-code value is a pointer to a memory location in receiver 72, the wrong memory location would be accessed and unknown data could be read.

A handshake signal could be passed between transmitter 70 and receiver 72 to ensure stable data before sampling, but this can add delays and reduce performance. Other examples and applications may have similar problems.

What is desired is a receiver that corrects errors in a received gray-code sequence. An error-corrector for gray-code values that have multiple bits changing at a time is desirable. An error corrector that converges over time to the correct value is desired.

DETAILED DESCRIPTION

The present invention relates to an improvement in gray-code error correctors. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 2:
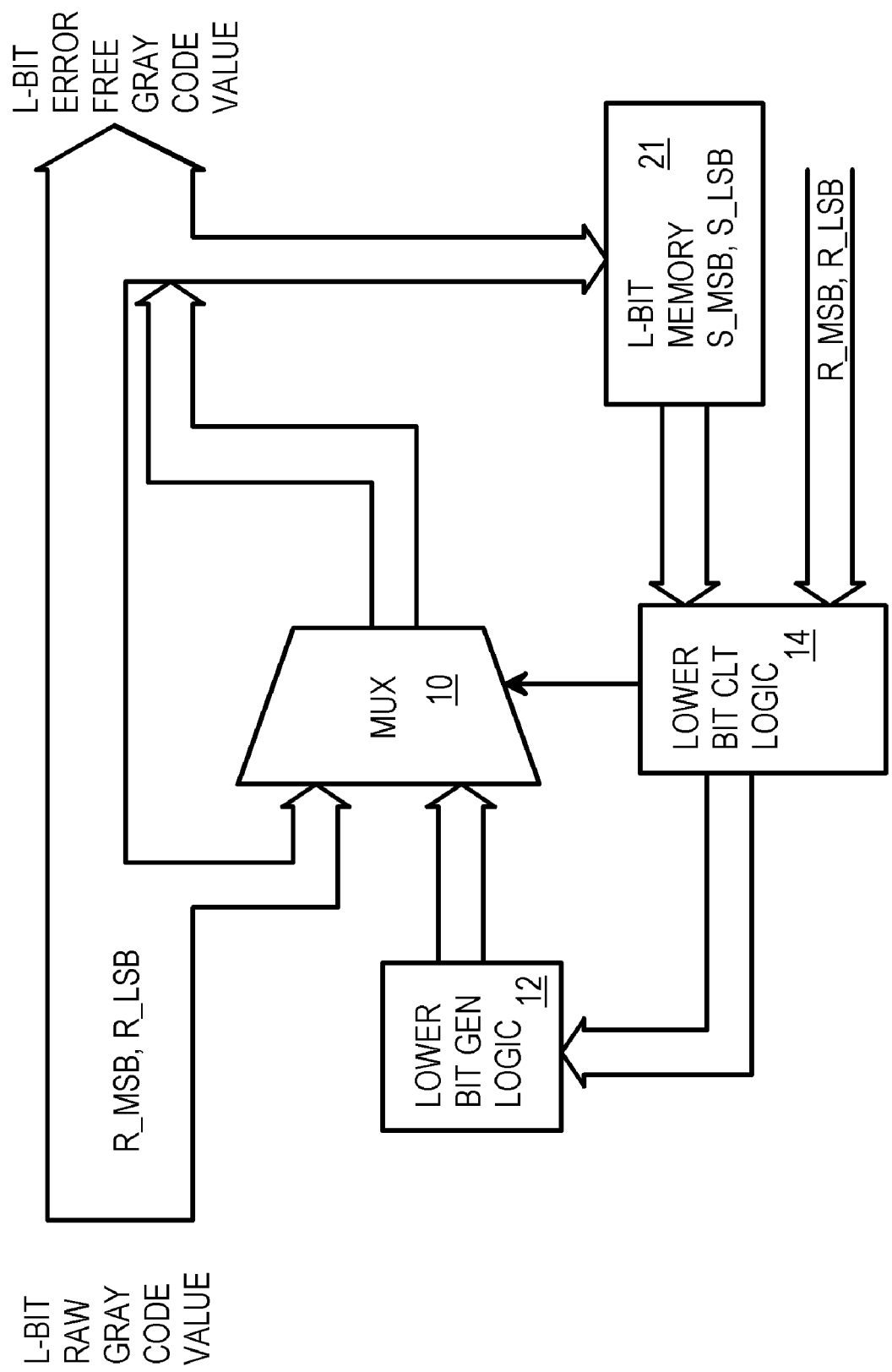
FIG. 2 is an overall block diagram of a gray-code error corrector.

FIG. 2 is an overall block diagram of a gray-code error corrector. An L-bit gray-code value is received as the raw value. The gray-code values can only increase, except when wrapping around. Rather than increment by just 1, N bits of the L bits can change with each new value input. For example, when N=2, two bits can change in the next gray-code value. The value can change by up to $2^N-1$. Each new value can change by 0, 1, 2, or 3 in this example.

The L-bit input is divided into two parts. The N least-significant-bits (LSB) can all change with each new value received and are designated the received LSB, R_LSB. The upper L–N bits are the received most-significant-bits, R_MSB. Bits N–1 . . . 0 are the R_LSB, while bits L–1 . . . N are the R_MSB.

In the gray-code sequence, no more than one of the upper L–N bits can change at a time. Thus the upper bits are less prone to errors. The upper L–N bits are stored as the stored MSB, S_MSB in memory 21 and output directly to downstream logic in the receiver.

The lower bits R_LSB are processed further for error correction. Lower bit control logic 14 can compare values of the stored and received MSB's and LSB's to determine what function to perform to generate the lower bits. Mux 10 receives the received LSB, R_LSB, and can pass these through to become the outputted and stored LSB, S_LSB when no changes occur in the MSB.

When lower-bit control logic detects a mismatch between R_MSB and S_MSB, the MSB has changed in the new raw value. Then the stored and received LSB's are examined. New lower bits are generated by lower-bit generation logic 12 and passed through mux 10 to become the outputted and stored LSB, S_LSB. The generated LSB bits from lower-bit generation logic 12 are used rather than the received LSB, R_LSB. Thus errors in R_LSB can be corrected.

Figure 1A:
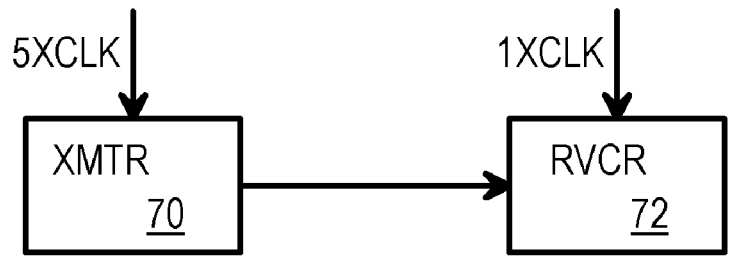
FIGS. 1A–B show a gray-code application with multiple bits changing between samples.
Figure 1B:
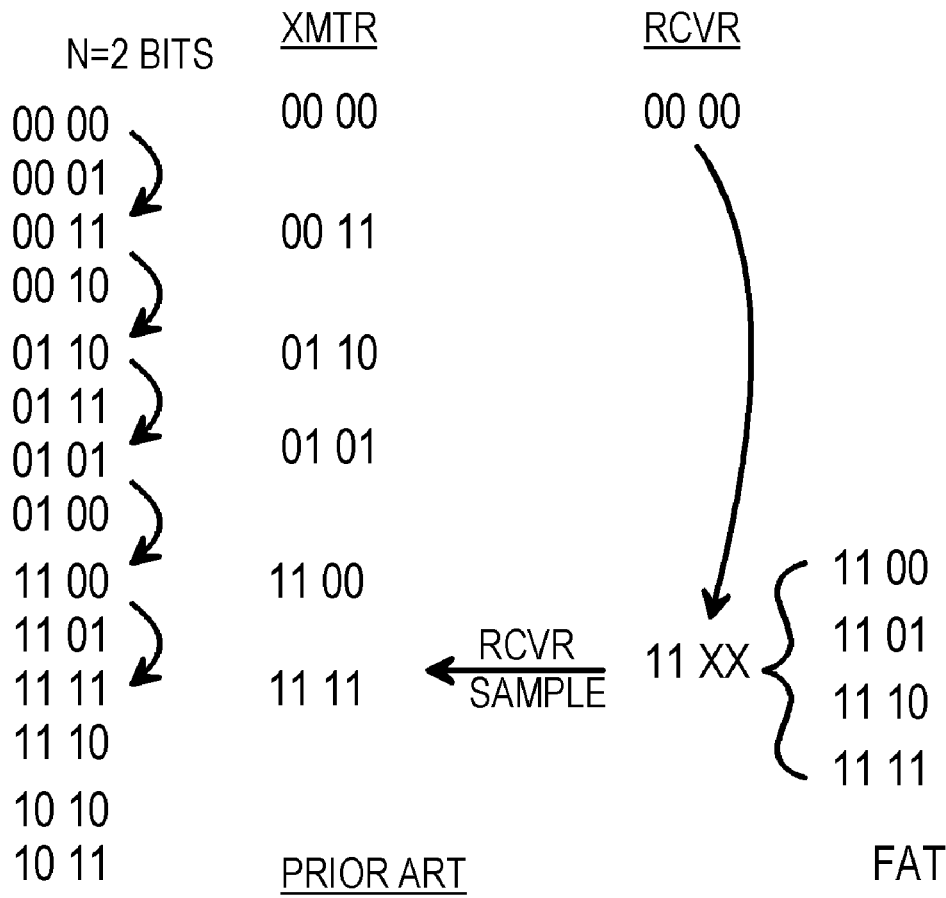

Lower-bit generation logic 12 generates the LSB's such that the lowest possible value of the overall stored value is generated. In binary this would be simple, since the LSB's could be set to all zeros. However, for gray-code, the lowest value is not necessarily all zeros. For example, when L=2 and N=2 and the MSB is 01, the lowest LSB is 10 not 00, since 0100 is larger than 0110 in the gray-code sequence shown in FIG. 1B.

Figure 3:
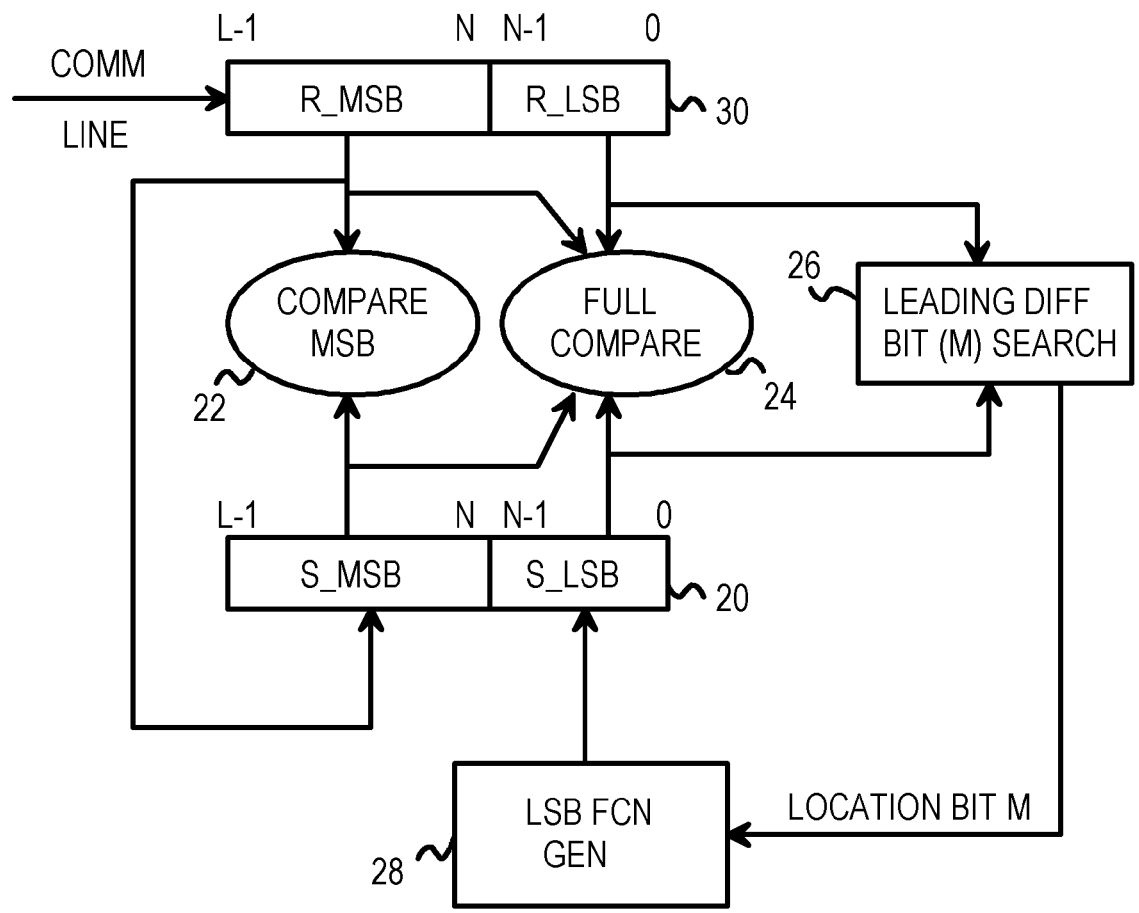
FIG. 3 shows comparators and lower-bit generation logic in more detail.

FIG. 3 shows comparators and lower-bit generation logic in more detail. Each new gray-code value is received over a communication line or other media and is stored in received register 30. Serial communication data may be converted to parallel and physical-transmission framing may be removed by a front-end of the receiver before data is loaded into received register 30.

Received register 30 contains the L-bit gray-code value divided into two halves. The lower N bits are the received LSB, R_LSB, while the upper L–M bits are R_MSB. The corrected gray-code value is stored in stored register 20 and can be output to downstream logic in the receiver for further processing. The corrected value in stored register 20 is also divided into two halves. The lower N bits are the stored LSB, S_LSB, while the upper L–M bits are stored MSB, S_MSB.

When a new value is received into received register 30, comparisons are made between the stored value in stored register 20 and the newly-received value in received register 30. MSB comparator 22 compares the MSB's from received register 30 (R_MSB) to S_MSB from stored register 20 to determine when the new MSB has changed.

When MSB comparator 22 determines that the MSB has not changed, full comparator 24 can compare all L bits in received register 30 to those in stored register 20. Searcher 26 can compare the received LSB from received register 30 to the stored LSB from stored register 20 to find the bit-position of the leading (most-significant) bit that differs among the LSBs. This position is known as bit M and its position is sent to function generator 28. Function generator 28 generates the lowest M bits of the LSB and writes these to the stored LSB, S_LSB, in stored register 20.

When MSB comparator 22 determines that the MSB has changed, the received MSB can be copied from received register 30 to stored register 20. Function generator 28 generates the new LSB to make the stored value in stored register 20 the smallest possible value. The generated LSB from function generator 28 is written to S_LSB in stored register 20.

Figure 4A:
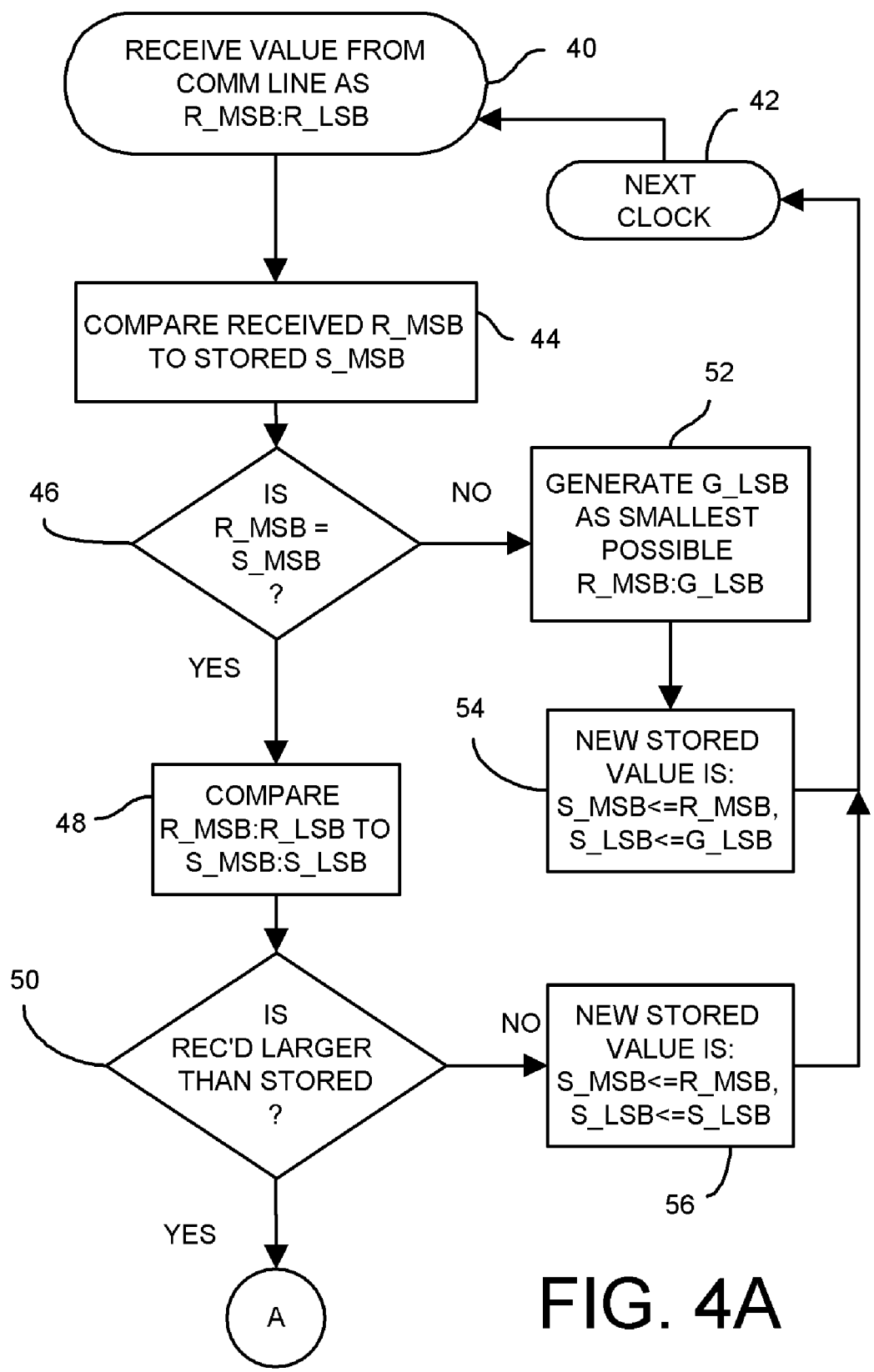
FIGS. 4A–B show a flowchart of error correction performed by the logic of FIG. 3.
Figure 4B:
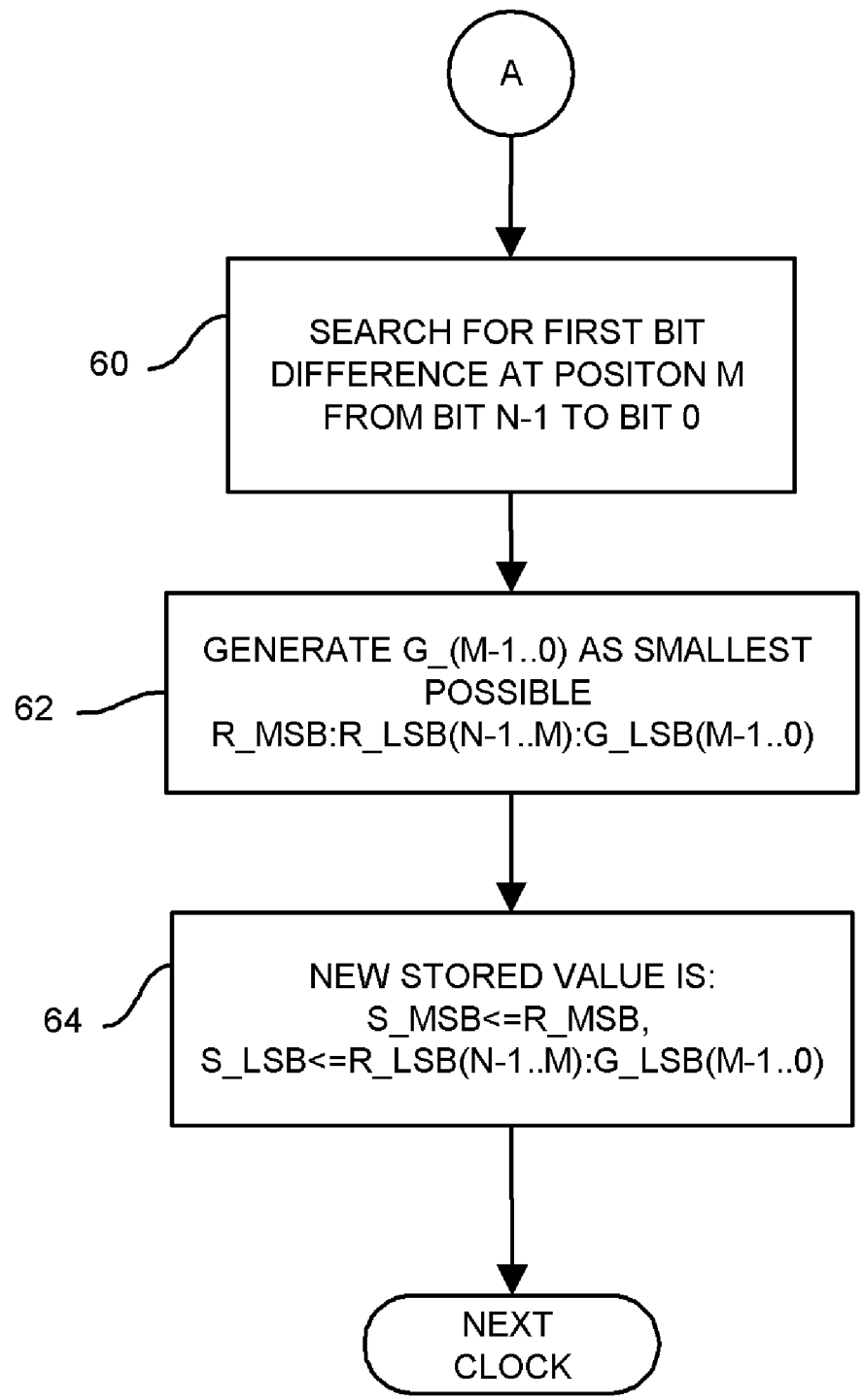

FIGS. 4A–B show a flowchart of error correction performed by the logic of FIG. 3. A new gray-code value is received, step 40, and divided into two parts: R_MSB and R_LSB. The received and stored MSB's are compared, step 44. When the MSB's differ, step 46, then the received value has advanced enough that the MSB has been incremented. To mask any error in the LSB, the generated LSB G_LSB is generated so that the overall combination of the received MSB and generated LSB, R_MSB:G_LSB, is the smallest possible value in the gray-code sequence, step 52. The new MSB is copied to the stored MSB and the generated LSB is copied to the stored LSB, step 54.

On the next receive-clock, step 42, the process can be repeated. This allows the stored value to be adjusted a second time when the received value, step 40, does not change. The stored value can then converge to the correct, error-free value over several clock cycles by repeating the flow of FIGS. 4A–B several times.

When the stored and received MSB's are equal, step 46, a full compare of all L bits of the received and stored values is performed, step 48. When the received value R_MSB: R_LSB is the same or smaller than the stored value S_MSB: S_LSB, step 50, then the stored value does not change, step 56.

When the received value R_MSB:R_LSB is the larger than the stored value S_MSB:S_LSB, step 50, then the process of FIG. 4B is performed. A search is performed for the first differing bit in the LSB's, starting from bit N–1 down to bit 0, step 60. The position of the most-significant differing bit between S_LSB and R_LSB is position M.

The lowest M bits of the LSB are generated as G_LSB (M–1 . . . 0), step 62. These M bits are generated so that the overall combination of the received MSB and up-per N–M bits of the received LSB, and the M generated LSB bits, R_MSB:R_LSB(N–1 . . . M): G_LSB(M–1 . . . 0), are the lowest possible value in the gray-code sequence. The received MSB R_MSB is copied to stored register 20 as S_MSB, while the stored LSB S_LSB is the combination of the upper N–M bits of the LSB that are identical in stored register 20 and in received register 30, and the lowest M generated bits G_LSB(M–1 . . . 0), step 64.

The procedure can repeat after the next receive-clock, step 42 of FIG. 4A. Convergence toward the correct, error-free result can over several clock periods and passes through the process steps of FIGS. 4A–B. For example, the position of bit M can shift to the right by one or more bit-positions for each pass until bit zero is reached and no more adjustments are needed.

Figure 5A:
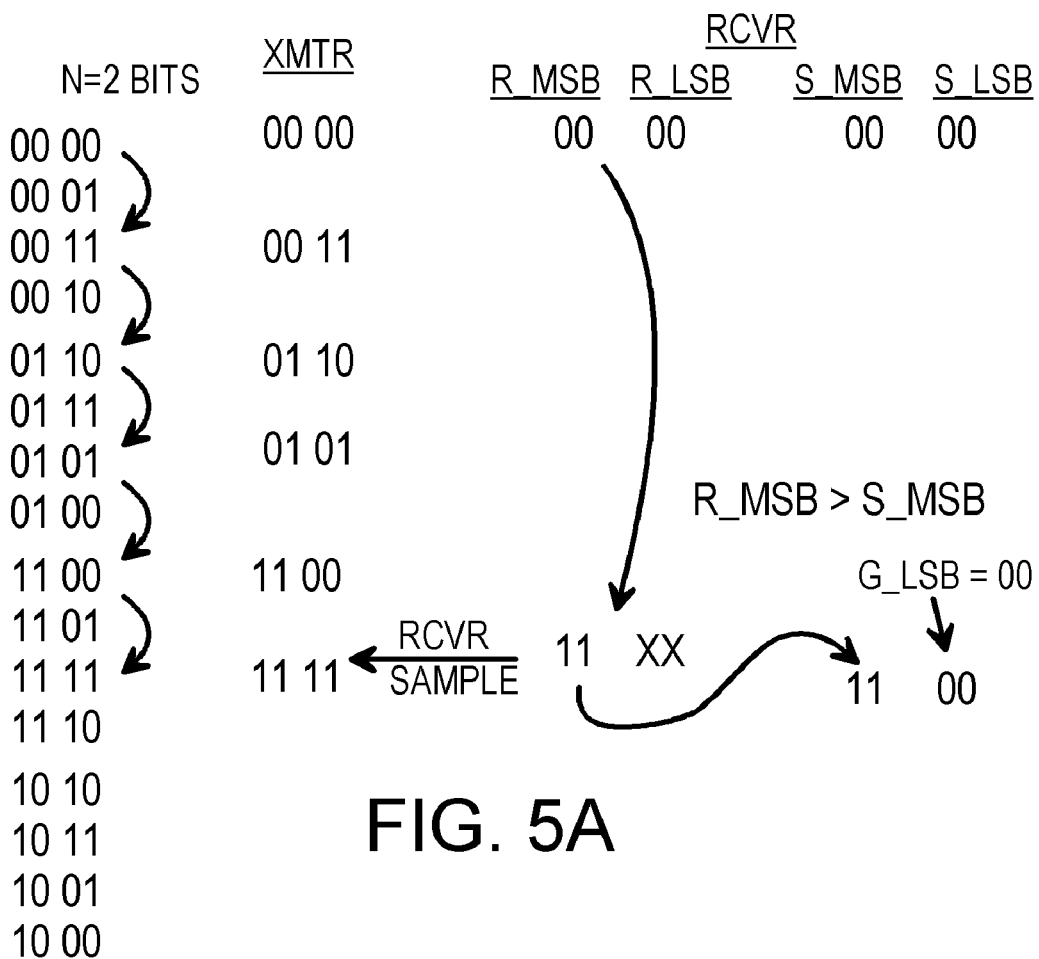
FIGS. 5A–C shows an example of correction of errors in gray code values.
Figure 5B:
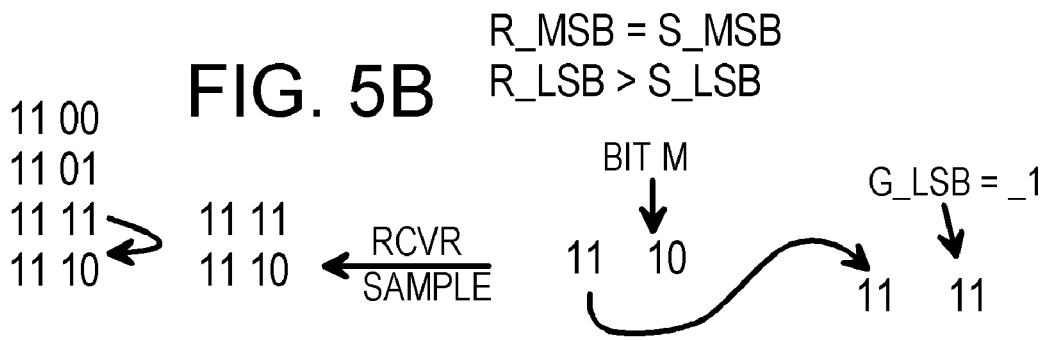
Figure 5C:
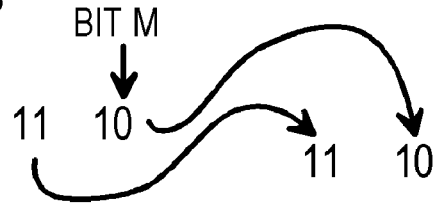

FIGS. 5A–C shows an example of correction of errors in gray code values. IN this example the transmitter is allowed to change 2 bits per transmitter clock (N=2). The transmitter's first value, 0000, is received by the receiver as R_MSB: R_LSB and stored as S_MSB:S_LSB. Since N=2, the LSB portion has 2 bits, and the remaining 2 bits are the MSB.

The transmitter's clock is 5 times faster than the receiver's clock. The transmitter outputs the sequence 0000, 0011, 0110, 0101, 1100, and 1111 over the next 5 clocks. The next receive clock occurs near the fifth transmitter clock, when the transmitter changes its output from 1100 to 1111. The received value 11XX can be any of the 4 values 1100, 1101, 1110, or 1111.

The MSB comparator compares the received MSB to the stored MSB. The stored MSB, S_MSB, is 00. The transmitter changed from 1100 to 1111, so the transmitted MSB is 11 for either transmitter-clock cycle. Since the MSB is the same, no error can occur in the MSB portion. Thus the received MSB, R_MSB, is 11.

Since the newly-received MSB is not equal to the stored MSB, the newly-received MSB is copied to stored register 20 as S_MSB. The generated LSB, G_LSB, is such that the smallest value of R_MSB:G_LSB is produced. Since R_MSB is 11, G_LSB is 00, since 1100 is smaller than 1101, 1111, or 1110 in the gray-code sequence. The generated LSB, G_LSB, is stored in stored register 20 as S_LSB.

In FIG. 5B, the transmitted value changes by only one, from 1111 to 1110 before the next receiver clock. The receiver samples the received MSB as 11, which matches the stored MSB, S_MSB. The entire L bits of the received value are then compared to the L-bits in stored register 20, and it is determined that the received L-bit word is larger than the stored L-bit word. The process of FIG. 4B is executed to search for the first mis-matching bit in the LSB, which is bit M=1, the second bit-position.

The received MSB is copied to stored register 20, and bit M (and none above) of R_LSB is copied to stored register 20. The lower M bits (only bit 0) of the LSB is generated to produce the smallest value of R_MSB:R_LSB(N−1 . . . M): G_LSB(M−1 . . . 0). The upper L−M bits are 111, and 1110 is larger than 1111 in the gray-code sequence, so bit 0 of G_LSB is generated as 1 and stored. The stored value is thus 1111. This still does not match the received value from the transmitter, but it can be corrected over then next clock.

In FIG. 5C, the transmitted value has not changed. At the next receive clock, the receiver again samples 1110, as in FIG. 5B, and stores 11 as R_MSB and 10 as R_LSB. The received MSB matches the stored MSB, S_MSB. The entire L bits of the received value are then compared to the L-bits in stored register 20, and it is determined that the received L-bit word (1110) is larger than the stored L-bit word (1111). The process of FIG. 4B is executed to search for the first mis-matching bit in the LSB, which is bit M=0, the lowest bit-position.

The received MSB is copied to stored register 20, and bit M and above (bits 1, 0) of R_LSB are copied to stored register 20. Since M=0, there are no lower bits to generate. The stored value is thus 1110. This now matches the received value from the transmitter, so no further corrections are needed in then next clock, unless the transmitted value changes again.

Convergence occurs in no more than N−1 extra clock periods. For this example of N=2, convergence occurred in the 2 receive-clock periods of FIGS. 5B–C once the transmitted value stabilized.

Alternate Embodiments

Several other embodiments are contemplated by the inventors. For example additional logic can be added for various functions and purposes. Pipeline registers can be added at various locations for data pipelining. The lower-bit generation logic, comparators, bit searchers, etc. could be implemented as hardwired logic gates or array logic, as a programmable logic array, a microcontroller, firmware, software, or some combination. Rather than searching for mis-matching bits, the search function could be implemented as a table look-up. Other functions could also be performed using a logic table.

Rather than increasing gray-code values, a sequence of decreasing gray-code values could be substituted. The low bits are generated to produce the largest value for decreasing sequences. An inverse of the gray code sequence, or a gray code sequence with inverted bits could be substituted. Various modifications to the gray code sequence could also be made. High-order bits could be changed or reflected in different ways. The clock rates of the transmitter and receiver could have different ratios than the example shown herein. Some applications may use a parallel or partially-parallel communications line, and the communications line could be internal to a larger chip. Bits of the received codeword could be received in various orders rather than have the LSB received last. Padding and framing bits may be transmitted but removed before the received codeword is presented to the lower-bit generation logic. Encoding schemes such as NRZ may be used to transmit the gray-code words.

While a 4-bit gray code has been shown in the examples, larger code words can be used, such as 8-bit, 20-bit, etc. The number of bits that can change, N, is usually a whole number greater than one, and could be much larger, such as 4 bits to allow a change to 16 possible values. L, M, and N are whole numbers. The physical media and other stages may use a faster or slower clock than the transmit and receive clocks. The rising or falling edge of the clock may signal the clock change, or a pulse may be used.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

The invention claimed is:

1. A gray-code error corrector comprising:

an input for receiving input gray-code words in a received sequence, the input gray-code words belonging to a full sequence of gray-code values, wherein successive gray-code values in the full sequence have only one bit difference, wherein the received sequence contains successively-received words that differ by a maximum of N bits, wherein N is a whole number of two or more, wherein the successively-received words differ in value by a maximum of $2^N-1$, a received register, coupled to receive an input gray-code word received by the input, the received register having an upper received-register that stores upper received bits and a lower received-register that stores N lower received bits of the input gray-code word;

a stored register that stores a corrected gray-code word, the stored register having an upper stored-register that stores upper stored bits and a lower stored-register that stores N lower stored bits of the corrected gray-code word;

an upper comparator, coupled to the received register and to the stored register, for comparing the upper received bits to the upper stored bits;

an upper loader, activated by the upper comparator when the upper received bits and the upper stored bits mismatch, for copying the upper received bits into the upper stored-register;

a low-bit generator that generates lower stored bits for loading into the lower stored-register such that the stored register has a lowest-possible value within the full sequence of gray-code values after loading; and a full comparator, coupled to the received register and to the stored register, activated when the upper comparator determines that the upper received bits match the upper stored bits to compare the input gray-code word to the corrected gray-code word.

2. The gray-code error corrector of claim 1 further comprising:

a differing-bit searcher, activated when the upper comparator determines that the upper received bits match the upper stored bits and when the full comparator determines that the input gray-code word is larger than the corrected gray-code word, for locating a first differing bit-position and loading bits above the first differing bit-position from the received register into the stored register and generating lowest-possible low bits for storage in the stored register below the first differing bit-position;

wherein the low-bit generator generates the lowest-possible low bits such that upon loading with the lowest-possible low bits the stored register has a lowest possible value within the full sequence of gray-code values.

3. The gray-code error corrector of claim 2 wherein the first differing bit-position is bit-position M, wherein M is a whole number and a lowest bit-position is position zero;

wherein the low-bit generator generates N low bits when the differing-bit searcher is not activated, but generates M low bits when the differing-bit searcher is activated.

4. The gray-code error corrector of claim 3 further comprising:

a re-activation controller, activated once the stored register is loaded, for re-activating the full comparator to compare the input gray-code word to the corrected gray-code word in the stored register after loading;

wherein successively-loaded values in the stored register are re-compared until the input gray-code word matches the corrected gray-code word in the stored register, whereby comparison and loading of the stored register are repeated until the corrected gray-code word matches the input gray-code word.

5. The gray-code error corrector of claim 4 wherein the stored register is loaded in response to a clock;

wherein the re-activation controller re-activates the full comparator in response to the clock, whereby comparison and loading of the stored register are repeated in response to the clock.

6. The gray-code error corrector of claim 5 wherein M is reduced on successive clock cycles of the clock when the input gray-code word does not change for the successive clock cycles;

wherein the corrected gray-code word becomes more accurate on the successive clock cycles, whereby the corrected gray-code word converges over the successive clock cycles to accurately track the input gray-code word.

7. The gray-code error corrector of claim 5 further comprising:

sample means, coupled to the input, for sampling the input in response to a receiver clock that differs from a transmitter clock, the input gray-code words being transmitted synchronously with the transmitter clock but sampled asynchronously by the receiver clock;

wherein when the transmitter clock is faster than the receiver clock, not all gray-code words in the received sequence are sampled;

wherein the input gray-code word and the corrected gray-code word differ by more than the maximum of N bits when the transmitter clock is faster than the receiver clock.

8. The gray-code error corrector of claim 7 wherein the clock that loads the stored register is the receiver clock or a derivative of the receiver clock.

9. A method for correcting transmission errors comprising:

receiving from a transmission medium a received codeword encoded using a gray code, the received codeword having a most-significant-bit (MSB) portion and a least-significant-bit (LSB) portion, the MSB portion being a received MSB and the LSB portion being a received LSB;

maintaining a stored codeword encoded using the gray code, the stored codeword having a stored MSB and a stored LSB;

comparing the received MSB to the stored MSB;

when the received MSB is different than the stored MSB, generating a generated LSB such that a combination of the received MSB and the generated LSB is a lowest-possible value in a sequence of the gray code, and storing the generated LSB as the stored LSB and storing the received MSB as the stored MSB and repeating the method upon a change of a clock;

when the received MSB matches the stored MSB, comparing the received LSB to the received LSB to determine when the received codeword is larger than the stored codeword; and when the received codeword is larger than the stored codeword, and the received MSB matches the stored MSB, searching for a first mis-matching bit between the received LSB and the stored LSB, the first mis-matching bit dividing the received LSB into an upper matched portion and a lower mis-matched portion, and generating the generated LSB having the upper matched portion from the received LSB and a generated lower mis-matched portion such that a combination of the received MSB, the upper matched portion and the generated lower mis-matched portion is a lowest-possible value in a sequence of the gray code, and storing the upper matched portion and the generated lower mis-matched portion as the stored LSB and repeating the method upon a change of the clock, whereby transmission errors are corrected by generating lower bits of the stored codeword.

10. The method of claim 9 wherein the method is repeated for each change of the clock even when the received codeword does not change.

11. The method of claim 9 wherein the received codeword and the stored codeword each comprise L bits;

wherein the stored LSB and the received LSB each comprise N bits;

wherein the stored MSB and the received MSB each comprise L–N bits, wherein L and N are whole numbers and L is greater than N.

12. The method of claim 10 wherein successive codewords sent over the transmission medium are increasing in value or remaining at a same value in a sequence of the gray code.

13. The method of claim 12 wherein successive codewords sent over the transmission medium can increase by a maximum of $2^N-1$ and have a maximum of N bits change between successive codewords.

14. The method of claim 11 wherein a multi-bit change of N bits in the received codeword cause the stored codeword to converge to a correct value over a maximum of N–1 extra cycles of the clock.

15. The method of claim 11 wherein a bit-position of the first mis-matching bit becomes less significant in position over N–1 extra cycles of the clock when the stored codeword is converging.

16. The method of claim 9 further comprising:

receiving a sequence of signals representing a new codeword from a transmitter over the transmission medium;

updating with the new codeword the received MSB and the received LSB of the received codeword in a received register upon the change of the clock; and updating the stored MSB and the stored LSB upon the change of the clock.

17. An error-correcting receiver comprising:

received word means, coupled to receive an input gray-code word, the received word means having an upper received-word of upper received bits of the input gray-code word, and a lower received-word of N lower received bits of the input gray-code word;

wherein successively-received input gray-code words differ by a maximum of N bits, wherein N is a whole number of two or more;

stored register means for storing a corrected gray-code word, the stored register means having an upper portion that stores upper stored bits and a lower portion that stores N lower stored bits of the corrected gray-code word;

upper comparator means, coupled to the received word means and to the stored register means, for comparing the upper received bits to the upper stored bits;

upper loader means, activated by the upper comparator means when the upper received bits and the upper stored bits mis-match, for copying the upper received bits into the upper portion of the stored register means;

low-bit generator means for generating lower stored bits for loading into the lower portion of the stored register means such that the stored register means has a lowest possible value within a sequence of gray-code values after loading;

full compare means, coupled to the received word means and to the stored register means, for comparing the input gray-code word to the corrected gray-code word; and differing-bit search means for locating a first differing bit-position and loading bits above the first differing bit-position from the received word means into the stored register means and generating lowest-possible low bits for storage in the stored register means below the first differing bit-position.

18. The error-correcting receiver of claim 17 further comprising:

control means for activating the full compare means and the differing-bit search means, wherein the full compare means is activated when the upper comparator means determines that the upper received bits match the upper stored bits; and wherein the differing-bit search means is activated when the upper comparator means determines that the upper received bits match the upper stored bits and when the full compare means determines that the input gray-code word is larger than the corrected gray-code word.

19. The error-correcting receiver of claim 18 further comprising:

clock means, for loading the stored register means in response to a clock, and for re-activating the full compare means to compare the input gray-code word to the corrected gray-code word in the stored register means after loading;

wherein loaded—loaded values in the stored register means are re-compared until the input gray-code word matches the corrected gray-code word in the stored register means, whereby comparison and loading of the stored register means are repeated until the corrected gray-code word matches the input gray-code word.

20. The error-correcting receiver of claim 19 further comprising:

line input means, coupled to the received word means, for receiving the input gray-code words in a received sequence over a communications line, the input gray-code words belonging to a full sequence of gray-code values, wherein successive gray-code values in the full sequence have only one bit difference, wherein the received sequence contains successively-received words that differ by a maximum of N bits, wherein N is a whole number of two or more, wherein the successively-received words differ in value by a maximum of $2^N-1$.

* * * * *